(12) United States Patent
Harris et al.

(10) Patent No.: US 7,768,092 B2
(45) Date of Patent: Aug. 3, 2010

(54) SEMICONDUCTOR DEVICE COMPRISING A JUNCTION HAVING A PLURALITY OF RINGS

(75) Inventors: Christopher Harris, Täby (SE); Cem Basceri, Reston, VA (US)

(73) Assignee: Cree Sweden AB, Kista (SE)

( * ) Notice: Subject to any disclaimer, the term of this patent is extended or adjusted under 35 U.S.C. 154(b) by 167 days.

(21) Appl. No.: 11/185,106

(22) Filed: Jul. 20, 2005

(65) Prior Publication Data
US 2007/0018171 A1    Jan. 25, 2007

(51) Int. Cl.
H01L 29/47    (2006.01)

(52) U.S. Cl. .................. 257/471; 257/472; 257/473; 257/54; 257/453; 257/260; 257/E21.425; 257/E21.45; 257/E51.009; 257/E29.013

(58) Field of Classification Search ......... 257/471–473, 257/453, E21.425, E21.45, E51.009, E29.013, 257/54, 260
See application file for complete search history.

(56) References Cited

U.S. PATENT DOCUMENTS

| | | | | |
|---|---|---|---|---|
| 4,648,174 | A * | 3/1987 | Temple et al. | 438/514 |
| 5,914,500 | A * | 6/1999 | Bakowski et al. | 257/77 |
| 5,932,894 | A * | 8/1999 | Bakowski et al. | 257/76 |
| 6,104,043 | A * | 8/2000 | Hermansson et al. | 257/77 |
| 6,320,205 | B1 * | 11/2001 | Pfirsch et al. | 257/77 |
| 6,670,688 | B2 * | 12/2003 | Satoh et al. | 257/484 |
| 7,318,349 | B2 * | 1/2008 | Vaganov et al. | 73/514.33 |
| 2003/0020133 | A1 * | 1/2003 | Dahlqvist et al. | 257/471 |
| 2008/0173974 | A1 * | 7/2008 | Van Noort et al. | 257/528 |

FOREIGN PATENT DOCUMENTS

| | | |
|---|---|---|
| EP | 0521558 | 1/1993 |
| EP | 0615291 | 9/1994 |
| EP | 0851505 | 7/1998 |
| EP | 1094524 | 4/2001 |
| WO | 98/32177 | 7/1998 |

OTHER PUBLICATIONS

Perez, R. et al.:"Optimization of Junction Termination Extension for the Development of a 2000 V Planar 4-H-SIC Diode," Diamond and Related Materials, vol. 12, pp. 1231-1235, (2003).

* cited by examiner

Primary Examiner—Kimberly D Nguyen
Assistant Examiner—Mohammad T Karimy
(74) Attorney, Agent, or Firm—Dilworth & Barrese LLP

(57) ABSTRACT

A semiconductor device comprises a first layer (1) of a wide band gap semiconductor material doped according to a first conductivity type and a second layer (3) on top thereof designed to form a junction blocking current in the reverse biased state of the device at the interface to said first layer. The device comprises extension means for extending a termination of the junction laterally with respect to the lateral border (6) of the second layer. This extension means comprises a plurality of rings (16-21) in juxtaposition laterally surrounding said junction (15) and being arranged as seen in the lateral direction away from said junction alternatively a ring (16-18) of a semiconductor material of a second conductivity type opposite to that of said first layer and a ring (19-21) of a semi-insulating material.

32 Claims, 4 Drawing Sheets

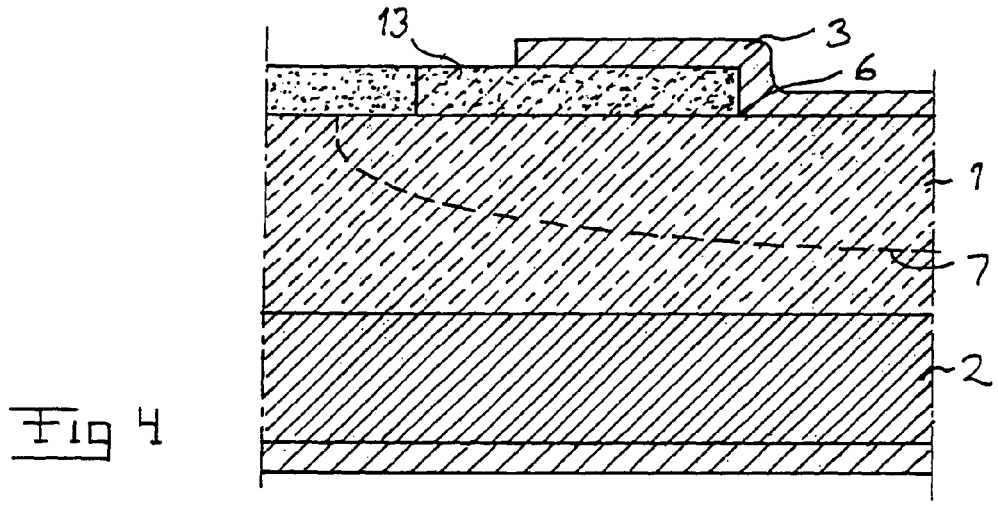
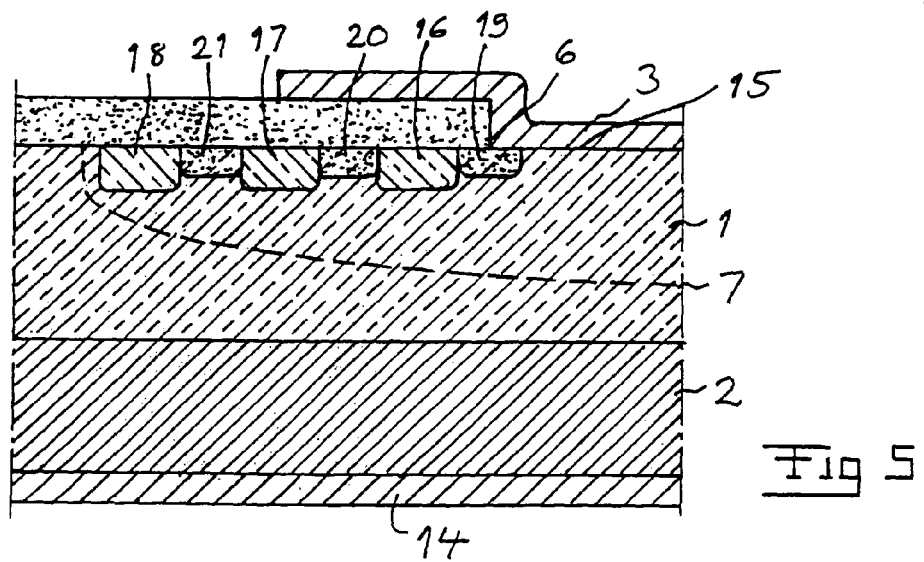
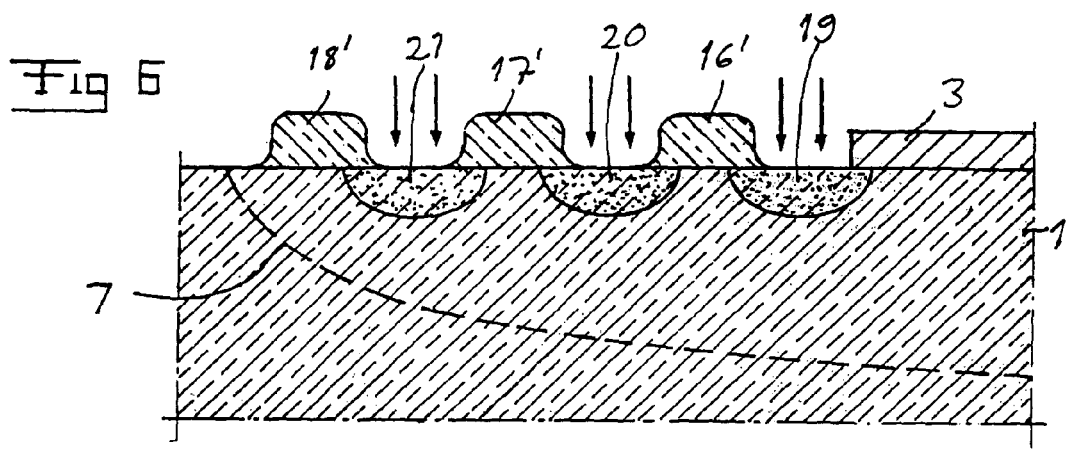

SEMICONDUCTOR DEVICE COMPRISING A JUNCTION HAVING A PLURALITY OF RINGS

BACKGROUND OF THE INVENTION

Technical Field of the Invention and Prior Art

The present invention relates to a semiconductor device comprising a first layer of a semiconductor material having an energy gap between the conduction band and the valence band exceeding 2.2 eV and being doped according to a first conductivity type, n or p, and a second layer on top thereof designed to form a junction blocking current in the reverse biased state of the device at the interface to said first layer, said device further comprising extension means for extending a termination of said junction and by that distributing the electric field within said first layer laterally with respect to the lateral border of said second layer.

Thus, the invention is directed to materials having a wide energy gap between the conduction band and the valence band, such as SiC, group 3 B-nitrides and diamond. These materials have in common that they have a higher breakdown field than for instance Si, and this is in the case of SiC more than 5 times higher. Furthermore, they have a higher thermal stability than for instance Si, so that devices fabricated from these materials are able to operate at high temperatures.

However, for utilizing these properties of said semiconductor material it is important to solve the problem of electric field crowding at the lateral edges of said blocking junction. This is the reason why said extension means are necessary. Without such extension means the breakdown voltage at said edges would in some cases be as low as 10-20% of the breakdown voltage at the junction under said second layer and determine the limit for the highest possible voltage applicable to the device. Accordingly, the design of these extension means is very important to fully benefit from the excellent properties of said semiconductor material.

This problem of electric field crowding is illustrated in FIG. 1 showing a Schottky diode having a first n-type drift layer 1 arranged on top of a highly doped n-type substrate layer 2. The second layer is formed by a metal 3 having a Schottky barrier with respect to the semiconductor material of the first layer for forming a said blocking junction in the form of a Schottky-junction. Furthermore, a passivation layer 4 is also seen in the Figure. It is illustrated how the electric field lines 5 are crowded at the lateral edge 6 of the Schottky-junction. The extension of the depletion region under the junction is shown by the dashed line 7.

Although a Schottky-junction is shown here, it is pointed out that the invention is also applicable to semiconductor devices of this type having a pn-junction as blocking junction.

It is also pointed out that the relative dimensions of the different layers shown in the Figures of this application are chosen for clearly illustrating the invention and the problems to be solved thereby and may in the reality be totally different.

One known way of realizing said extension means already known is shown in FIG. 2, which shows the left side of a device according to FIG. 1. A so-called junction termination extension is here obtained by consecutive rings 8-10 laterally surrounding said junction and being doped according to a second conductivity type opposite to that of the first layer 1 with a doping concentration decreasing outwardly from the ring 8 to the ring 10. This means that the border 7 of the depletion region will be extended further laterally beyond the edge 6 and gradually coming closer to said rings 8-10, since the potential of these rings falls in the lateral direction away from the edge 6. However, this type of extension means requires an accurately controlled doping of the rings, since the electric field will otherwise be too high at the transitions between adjacent rings reducing the breakdown voltage of the device. Furthermore, charges may be produced in the passivation layer as a consequence of for example moisture further reducing the breakdown voltage.

Another known type of extension means is illustrated in FIG. 3 and consists of so-called floating field rings 11, 12 laterally arranged with respect to said edge 6 and assuming in the lateral direction gradually lower potentials for favourably extending the depletion region as shown by the dashed line 7. A problem of this solution is that electric field concentrations may result lowering the breakdown voltage of the device.

A third known type of extension means is illustrated in FIG. 4 and consists of arranging a layer 13 of a semi-insulating material, such as SIPOS (Semi-insulating Polycrystalline Silicon) laterally to said lateral edge 6 of the junction. The semi-insulating material may just as well be called semi-resistive, and it results in a leakage current therethrough to the second layer 3 (the metal) in the reverse biased state of the device, so that the depletion region will be extended in almost the same way as for the solutions according to FIGS. 2 and 3. However, the resistivity of such a semi-insulating material is highly temperature dependent, so that the leakage current increases with the temperature. This is not further serious when the semiconductor material is Si, since the possible operation temperatures of such a device are rather low, in the region of not higher than 120° C. in the drift layer 1. However, in the case of a semiconductor material having an energy gap between the conduction band and the valence band exceeding 2.2 eV, such as for example SiC, operation temperatures in the region of 200° C. or even higher may be envisaged. In such a case the leakage current through the layer 13 of said semi-insulating material will increase considerably making this solution not suitable for a device of this type.

SUMMARY OF THE INVENTION

The object of the present invention is to provide a semiconductor device of the type defined in the introduction at least partially solving the problems of extending a termination of said junction associated with such devices already known.

This object is according to the invention obtained by providing such a semiconductor device with an extension means having a plurality of rings in juxtaposition laterally surrounding said junction and being arranged as seen in the lateral direction away from said junction alternatively a ring of a semiconductor material of a second conductivity type opposite to that of said first layer and a ring of a semi-insulating material.

This way of combining floating field rings with semi-insulating rings located therebetween reduces the drawback of each of these techniques mentioned above while benefiting from the advantages of each of these techniques. Thus, the semi-insulating rings are used for creating a leakage current reducing the field concentrations which may be created at the edges of the floating field rings, i.e. said rings of a semiconductor material doped according the second conductivity type. The location of these semiconductor material rings between two consecutive rings of semi-insulating material means in its turn that the leakage current is interrupted therethrough, so that the leakage current may be kept at an acceptable low level also when the temperature increases to levels possible as operation temperatures for these wide band gap materials.

According to an embodiment of the invention said second layer is formed by a metal having a Schottky-barrier with respect to the semiconductor material of said first layer for forming a said blocking junction in the form of a Schottky-junction. A Schottky-junction has normally a lower breakdown voltage than a pn-junction, so, that this improved properties of the extension means makes it possible to have a semiconductor device with a Schottky-junction as an attractive alternative also for applications of higher blocking voltages and/or higher temperatures (for instances as a consequence of high switching frequencies) than before.

According to another embodiment of the invention said second layer is made of the same semiconductor material as said first layer but doped according to said second conductivity type for forming a said blocking junction in the form of a pn-junction. The advantages of said improved properties of the extension means may be equally utilized for a semiconductor device having a pn-junction as blocking junction.

According to another embodiment of the invention the innermost ring of a semiconductor material is laterally spaced with respect to the lateral border of said second layer. This means that there will be a voltage drop between the lateral border of said second layer and this innermost semiconductor material ring reducing electric filed crowding at said lateral border.

According to another embodiment of the invention said second layer is formed by a metal having a Schottky-barrier with respect to the semiconductor material of said first layer and the innermost ring of the semiconductor material is in contact with said second metal layer. Such a design results in an extra advantage of this extension means in the forward conducting state of the device, since an extra channel for the current at surge is formed through the pn-junction so created between this innermost ring and said first layer, so that the current-voltage characteristic of a Schottky-junction is then combined with that of a pn-junction.

Each said ring of a semiconductor material may be formed by a ring in said first layer having dopants of said second conductivity type implanted thereinto for locally changing the conductivity type of this ring with respect to that of said first layer, or each said ring of a semiconductor material may be formed by a ring of said semiconductor material with dopants of said second conductivity type therein epitaxially grown on top of said first layer.

Each said ring of a semi-insulating material may be formed by a ring in said first layer having dopants implanted thereinto remaining electrically inactive so that this ring has a resistivity making it semi-insulating or each said ring is formed by a ring of said semi-insulating material grown on top of said first layer.

When arranging said consecutive rings being alternatively of a doped semiconductor material and of a semi-insulating material it is important to chose the lateral spacing of two consecutive said rings of a semiconductor material so that the ideal case occurs, namely that these so-called field rings will share the applied voltage equally when the device is in the reverse blocking state, so that an avalanche breakdown would be produced at the outer edges of all the field rings simultaneously. If for instance four such field rings are arranged and 2 kV is applied in the reverse direction over the device there should be a potential difference of 500 V of the rings of each couple of consecutive said rings of a semiconductor material doped according to said second conductivity type. Furthermore, when selecting the distance between two such consecutive rings the voltage intended to be applied over the device in the reverse blocking direction has to be considered, and this distance has to be increased when the value of said voltage is increased so that the lateral width of the semi-insulating ring located therebetween is increased and thereby the resistance of the latter ring is increased at a given resistivity thereof, which means that the leakage current through this ring of semi-insulating material will be kept on an acceptable level.

The lateral spacing of two consequtive said rings of a semiconductor material is suitably 5-50 μm.

According to another embodiment of the invention each said ring of a semi-insulating material has a resistivity of $10\text{-}10^3 \Omega \times cm$ at room temperature resulting in an appropriate leakage current therein in the reverse blocking state of a semiconductor device of this type.

According to another embodiment of the invention said semi-insulating material is one of amorphous SiC, DLC (Diamond Like Carbon) and SIPOS (Semi-insulating Polycrystalline Silicon). These materials are well suited to be used as semi-insulating materials in semiconductor devices utilizing the properties of a wide band gap semiconductor material.

According to another embodiment of the invention said semiconductor material of said first layer is one of SiC, a group 3B-Nitride, such as GaN, and diamond. These semiconductor materials are known to have excellent properties useful for semiconductor devices which should be able to take high voltages in the reverse blocking state thereof and/or operate at high frequencies and/or high temperatures.

According to another embodiment of the invention the semiconductor material of said first layer is SiC or a group 3B-Nitride, said first layer is an n-type layer, and each said ring of a semiconductor material is formed by the same semiconductor material as the first layer and has a doping concentration of $5 \times 10^{15}\text{-}10^{18} \, cm^3$. This doping concentration of said so-called field rings has turned out to be suitable for the task they have to fulfil.

According to another embodiment of the invention said semiconductor material of said first layer is diamond, and the junction of this semiconductor device is then a Schottky-junction with said first layer being a p-type layer, which is easier to achieve than n-type layers in diamond, and each said ring of a semiconductor material is also of diamond doped with n-type dopants, such as Li. It does not matter that so far diamond may only be n-type doped with the dopants at deep energy levels, since the so-called field rings do not form a path for the current in the forward conducting state of the device.

The invention also relates to methods for producing said extension means of a semiconductor device according to the invention appearing from the appended method claims. These methods include steps familiar to a person with skill in the art and do not require any further explanation.

Further advantages as well as advantageous features of the invention appear from the following description and the other dependent claims.

BRIEF DESCRIPTION OF THE DRAWINGS

With reference to the appended drawings, below follows a specific description of preferred embodiments of the invention cited as examples.

In the drawings:

FIGS. 2-4 are schematic views of a semiconductor device according to FIG. 1 illustrating the principal of different known techniques for extending the termination of the Schottky-junction laterally, FIG. 5 is a view similar to the views of FIGS. 2-4 illustrating a semiconductor device according to a first embodiment of the present invention, FIG. 6 is an enlarged view showing mainly said extension means of a semiconductor device according to a second embodiment of the present invention.

THE PREFERRED EMBODIMENTS

FIG. 5 illustrates by way of a non-limitative example of a device to which the invention may be applied, a Schottky-diode with two semiconductor layers of SiC, namely a highly doped substrate layer 2 of n-type and a first lightly doped drift layer 1 of n-type. The donors used are for example N or P. The device has also an ohmic metal contact 14 arranged next to the substrate layer and a second layer 3 applied on top of the first layer 1 in the active region of the device, which second layer is formed by a metal having a Schottky-barrier with respect to the semiconductor material of the first layer, i.e. here SiC, for forming a Schottky-junction at the interface between the first layer 1 and the second layer 3. Typical Schottky metals useful for said second layer are Ti, Cr, Al, W, Mo, Ni, Au and Pt.

Figure 1:
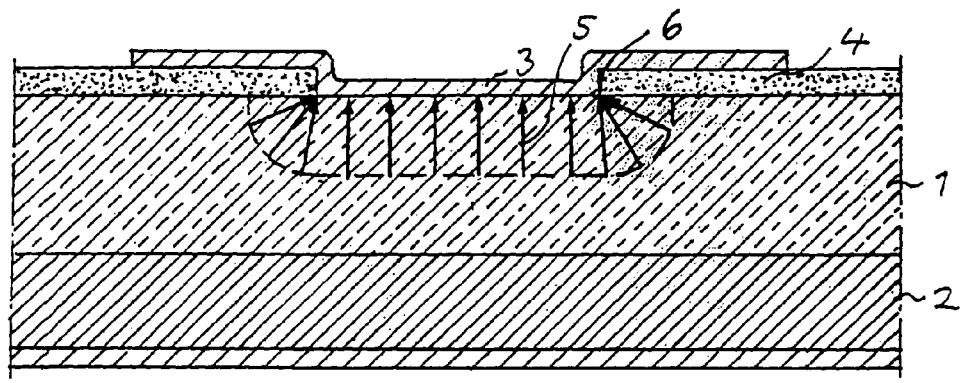
FIG. 1 is a schematic view of a Schottky-diode already known used for illustrating the phenomena of electric field crowding at the lateral edges of the Schottky-junction.
Figure 2:
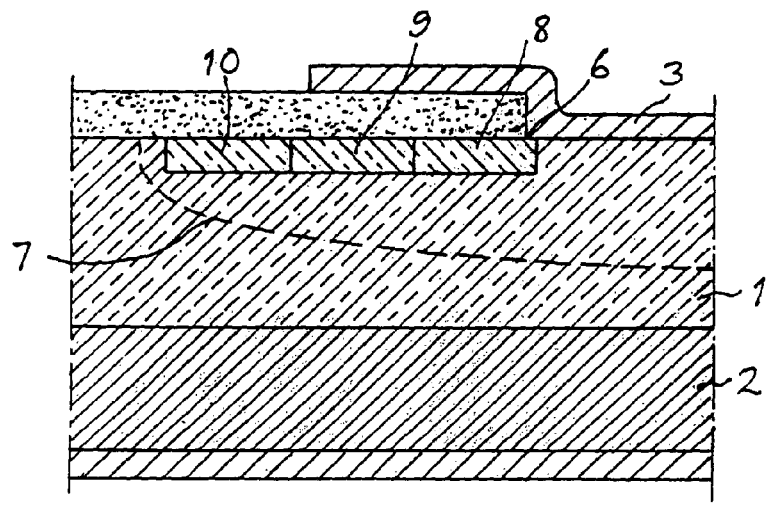
Figure 3:
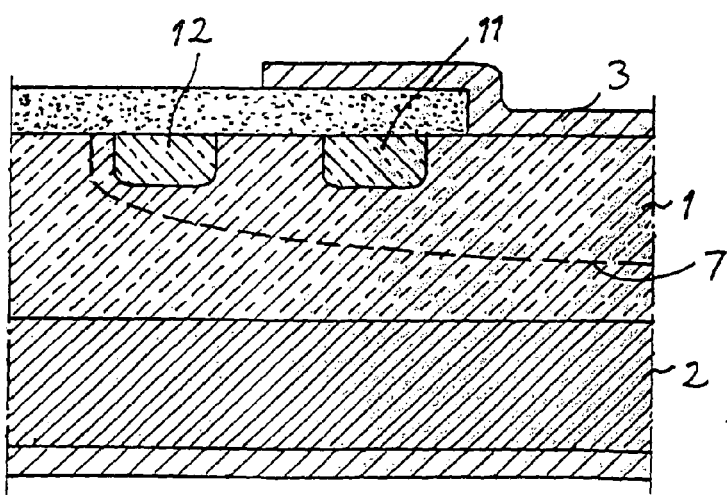

A Schottky-diode is provided with an extension means for extending a termination of said Schottky-junction and thereby distributing the electric field within said first layer laterally with respect to the lateral border 6 of the second layer 3 for avoiding electric field crowding there as illustrated in FIG. 1. It is pointed out that FIG. 5 is only used for explaining the principle of this extension means, and mutual proportions of the components thereof as well as the number of these components may in the practice be totally different depending on the intended application of the device, and this remark is applicable to all the FIGS. 5-10. Said extension means comprises a plurality of rings in juxtaposition laterally surrounding said junction 15 and being arranged as seen in the lateral direction away from said junction alternatively a ring 16-18 of a semiconductor material of a second conductivity type opposite to that of said first layer, namely here p-type, and a ring 19-21 of a semi-insulating material. The so-called field rings 16-18 have been formed by implantation of p-type dopants, such as B or Al, into the first layer for locally changing the conductivity type of these rings with respect to that of said first layer and subsequent annealing of these rings for making the dopants implanted electrically active. The rings 19-21 of semi-insulating material are formed by implantation of dopants into said first layer according to these rings without making them electrically active, so that these rings will have a resistivity making them semi-insulating.

The function of this design of the extension means in the reverse blocking state of the device is schematically indicated by the dashed line 7 showing in a very simplified manner the border of the depletion region in a device in a said blocking state. The voltage between consecutive field rings, 16 and 17 and 17 and 18, as well as between the border 6 and the field ring 16 is in this way preferably approximately the same in said blocking state. Thanks to the layers of semi-insulating material between consecutive such field rings allowing a leakage current flow therethrough electric field concentrations at the edges of the field rings 16-18 are avoided, and the field rings ensure an interruption of said leakage current through the spacing of consequtive rings of semi-insulating material thus obtained.

FIG. 6 shows an alternative design of the extension means explained with reference to FIG. 5, which differs therefrom by the fact that the rings 16'-18' of a semiconductor material are formed by epitaxial growth of SiC with p-type dopants on top of the first layer 1. It is further very schematically indicated how the rings 19-21 of semi-insulating material are obtained by ion implantation as in the embodiments according to FIG. 5 after etching through the layer epitaxially grown for forming said rings 16'-18' and while having a mask not shown on top of the rings 16'-18' during said implantation. Thus, this Figure as well as the following Figures may be used for explaining how the extension means have been produced without in detail showing the different steps thereof.

Figure 7:
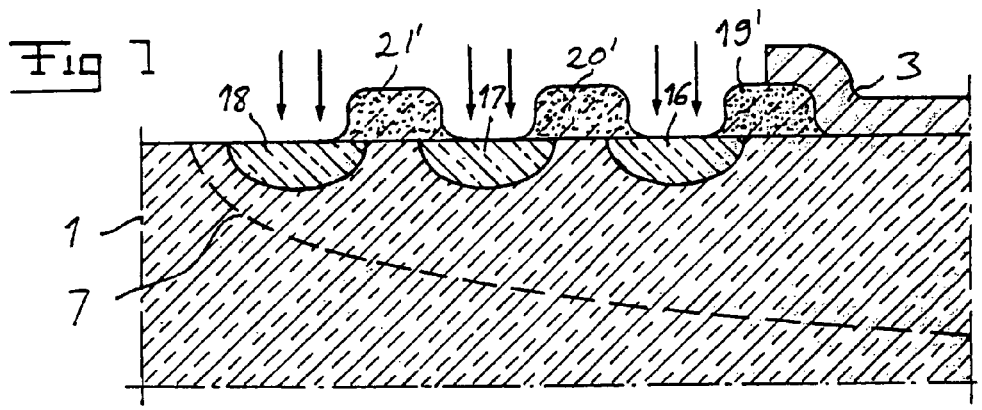
FIGS. 7 and 8 are views corresponding to that of FIG. 6 of semiconductor devices according to a third and a fourth embodiment of the present invention, respectively, having alternative designs of said extension means.

FIG. 7 shows an alternative design of the extension means, in which the rings of semi-insulating material 19'-21' are formed by growing a layer of said semi-insulating material on top of the first layer 1. The rings 16-18 are here instead formed by implantation, with the difference that annealing has here also to take place for making the dopants implanted electrically active.

Figure 8:
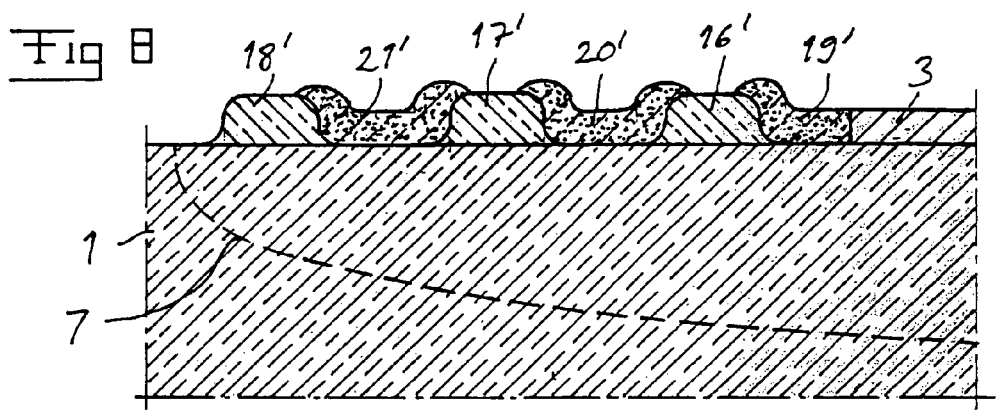

FIG. 8 shows how the rings 16'-18' of p-type doped SiC as well as the rings 19'-21' of semi-insulating material are formed by consecutive growth on top of said first layer. In this case a p-type doped SiC layer may first be epitaxially grown on top of the first layer 1 and then be etched for forming said rings 16'-18', whereupon the semi-insulating material may be grown thereupon. Subsequently a mask may be applied and etching will take place down to the rings 16'-18' for forming rings 19'-21' of semi-insulating material.

Figure 9:
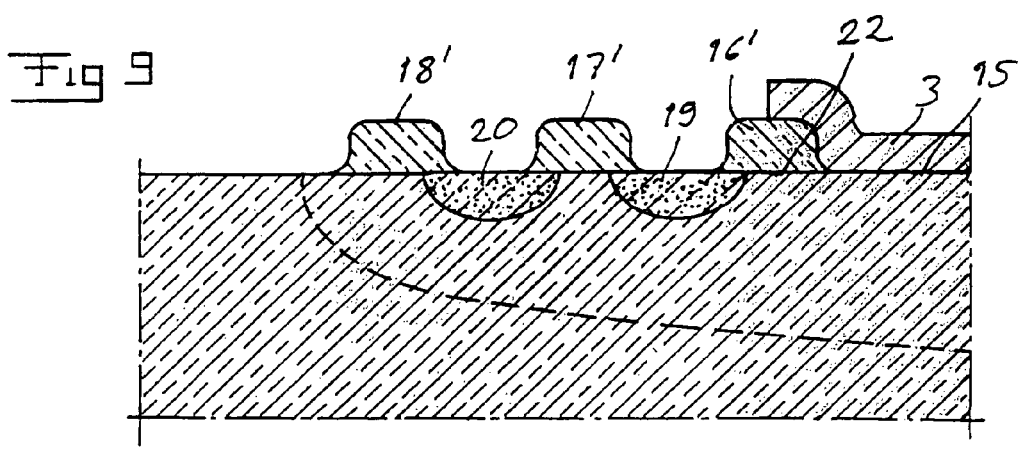
FIG. 9 is a view corresponding to that of FIG. 6 of a device according to a fifth embodiment of the invention.

FIG. 9 illustrates a semiconductor device having the same type of extension means as the one according to FIG. 6, but the innermost field ring 16' has here been arranged in contact with the metal layer 3 influencing the behaviour of the device in the forward conducting state thereof. A pn-junction 22 will in this way be formed at the interface between this ring 16' and the first layer in parallel with the Schottky-junction 15 of the active region of the device. This means that an extra channel for the current through the device upon surge is created. Thus, there will be a junction 15 having a current with a Schottky-dependence of the forward voltage applied across the device in overlap with a current with a pn-junction dependence of the forward voltage applied across the device, i.e. a much steeper extension but starting from a higher voltage level.

Figure 10:
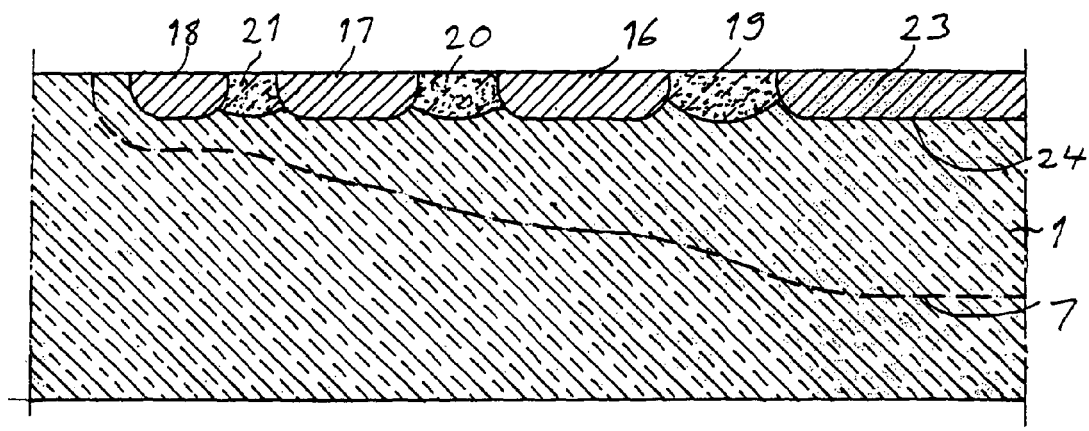
FIG. 10 is a view according to FIG. 6 of a device according to a sixth embodiment of the invention.

FIG. 10 illustrates a device having a blocking junction in the active region thereof in the form of a pn-junction 24 by the fact that said second layer 23 is formed by a highly doped p-type layer. The extension means is designed according to the principle shown in FIG. 5, but it is here illustrated how the width of the field rings 16-18 decreases in the direction away from the lateral edge 6 of the second layer 23 and how the distances between consecutive such rings also decreases in that direction.

The choice of the design of the extension means among the alternatives described above may be dependent upon the intended use of the device, the semiconductor material of the device, the development of the techniques for manufacturing the device and in particular this extension means and/or other considerations.

The invention is of course not restricted to the embodiments described above, but many possibilities to modifications thereof will be apparent to a person with ordinary skill in the art without departing from the basic idea of the invention as defined in the appended claims.

It is pointed out that the invention is applicable to all types of semiconductor devices having a junction blocking current in a reverse biased state of the device and where electric field crowding at the lateral edges of the junction should be avoided, not only Schottky diodes and pn-diodes.

Furthermore, "on top of" as used in this disclosure is of course to be interpreted broadly and also covers the case in which a device of this type is turned upside-down, so that the first layer is located above the second layer or the device is turned by any other arbitrary angle with respect to the position in the appended figures.

The number of said rings may be as low as two, one field ring and one semi-insulating ring, with no exact upper limit. Although more than twenty are unlikely.

The rings of semi-insulating, i.e. semi-resistive, material may be formed by a low doped material being a semiconducting material when higher doped, such as low doped SiC. Such rings may then for instance be achieved by epitaxially growing a thin capping layer of low doped semi-insulating SiC and then forming the p-type rings as described above for example with reference to FIG. 7.

The invention claimed is:

1. A semiconductor device comprising a first layer (1) of a semiconductor material having an energy gap between the conduction band and the valence band exceeding 2.2 eV and being doped according to a first conductivity type, n or p, and a second layer (3) on top thereof designed to form a junction (15) blocking current in a reverse biased state of the device at an interface to said first layer, said device further comprising extension means for extending a termination of said junction and by that distributing the electric field within said first layer laterally with respect to a lateral border (6) of said second layer (3),
wherein said extension means comprises a plurality of annular, concentric rings in juxtaposition laterally surrounding said junction and being arranged, in a lateral direction away from said junction, alternately a ring (16-18) of a semiconductor material of a second conductivity type opposite to that of said first layer (1) and a ring (19-21) of a semi-insulating material having different characteristics from said semi-conductor material of both said first layer (1) and rings (16-18) of said second conductivity type.

2. A device according to claim 1, wherein said second layer (3) is formed by a metal having a Schottky-barrier with respect to the semiconductor material of said first layer (1) for forming said blocking junction in the form of a Schottky-junction (15).

3. A device according to claim 2, wherein an innermost ring (16') of a semiconductor material is in contact with said second metal layer (3).

4. A device according to claim 2, in which said semiconductor material of said first layer (1) is diamond, said first layer is a p-type layer and each said ring (16-18, 16'-18') of a semiconductor material is also of diamond doped with n-type dopants, such as Li.

5. A device according to claim 1, comprising a series of said alternating rings (16-18 and 19-21).

6. A device according to claim 5, comprising three said rings (16-18) of semi-conductor material and three said rings (19-21) of semi-insulating material, with one (19) of said semi-insulating rings (19-21) bordering said second layer (3) at said junction (15).

7. A device according to claim 5, wherein said series of rings (16-18 and 19-21) are embedded in said first layer (1).

8. A device according to claim 7, wherein said first layer (1) is a lightly-doped drift layer of n-type conductivity, and additionally comprising a substrate (2) of highly-doped n-type conductivity situated underneath said first layer (1) and an ohmic metal contact (14) situated underneath said substrate (2).

9. A device according to claim 1, wherein said semiconductor material of said first layer (1) is one of SiC, a group 3B-Nitride, and diamond.

10. A device according to claim 8, in which the semiconductor material of said first layer (1) is SiC or a group 3B-Nitride, said first layer is a n-type layer, and each said ring (16-18, 16'-18') of a semiconductor material is formed by the same semiconductor material as the first layer and has a doping concentration of $5 \times 10^{15}$-$10^{18}$ cm$^{-3}$.

11. A device according to claim 9, wherein the group 3B-Nitride is GaN.

12. A device according to claim 1, additionally comprising a layer (13) of semi-insulating material situated adjacent said lateral border (6) and above said rings (16-18, 19-21).

13. A device according to claim 12, wherein said lateral border (6) extends in plane or direction away from said first layer (1).

14. A device according to claim 1, wherein each said ring (19-21) of a semi-insulating material comprises dopants and is electrically inactive compared to said surrounding first layer (1) such that this ring (19-21) possesses a semi-insulating resistivity.

15. A device according to claim 14, wherein dopants are implanted into each said ring (16-18) of semi-conductor material of second conductivity type for locally changing conductivity of said rings (16-18) with respect to said first layer (1) and followed by making said rings (16-18) electrically active, and the dopants are implanted into each said ring (19-21) of semi-insulating material within said first layer (1) without making each said ring (19-21) of semi-insulating material electrically active, such that each said ring (19-21) of semi-insulating material possesses resistivity making the same semi-insulating.

16. A device according to claim 1, wherein said second layer (23) is made of the same semiconductor material as said first layer but doped according to said second conductivity type for forming said blocking junction in the form of a pn-junction (24).

17. A device according to claim 1, wherein the innermost ring (16) of a semiconductor material is laterally spaced with respect to the lateral border (6) of said second layer (3).

18. A device according to claim 1, wherein each said ring (16-18) of a semiconductor material is formed by a ring in said first layer (1) having dopants of said second conductivity type implanted thereinto for locally changing the conductivity type of this ring with respect to that of said first layer (1).

19. A device according to claim 1, wherein each said ring (16'-18') of a semiconductor material is formed by a ring of said semiconductor material with dopants of said second conductivity type therein epitaxially grown on top of said first layer (1).

20. A device according to claim 1, wherein each said ring (19'-21') of a semi-insulating material is formed by a ring of said semi-insulating material grown on top of said first layer.

21. A device according to claim 1, wherein each said ring (19-21, 19'-21') is formed by a semi-insulating material in the form of a low doped material being a semiconducting material when higher doped, such as SiC.

22. A device according to claim 1, wherein each said ring (19-21) of a semi-insulating material has a resistivity of $10$-$10^3$ Ω×cm at room temperature.

23. A device according to claim 22, wherein said semi-insulating material is one of amorphous SiC, DLC (Diamond Like Carbon) and SIPOS (Semi-Insulating Polycrystalline Silicon).

24. A device according to claim 1, wherein the lateral spacing of two consecutive said rings (16, 17 or 17, 18) of a semiconductor material is 5-50 μm.

25. A device according to claim 1, wherein said rings of semiconductor (16-18) and semi-insulating (19-21) material all directly contact said first layer (1).

26. A device according to claim 1, additionally comprising a passivation layer (4) situated on top of said rings of semi-conductor (16-18) and semi-insulating (19-21) material, underneath said second layer (3) and adjacent said lateral border (6).

27. A device according to claim 1, wherein p-n junctions are only formed between said first layer (1) and rings (16-18) of semiconductor material.

28. A device according to claim 1, wherein said rings of semi-insulating material (19-21) are non-electrically active.

29. A device according to claim 1, wherein said lateral border (6) extends in a plane or direction away from said first layer (1).

30. A semiconductor device comprising a first layer (1) of a semiconductor material having an energy gap between the conduction band and the valence band exceeding 2.2 eV and being doped according to a first conductivity type, n or p, and a second layer (3) on top thereof designed to form a junction (15) blocking current in a reverse biased state of the device at an interface to said first layer, said device further comprising extension means for extending a termination of said junction and by that distributing the electric field within said first layer laterally with respect to a lateral border (6) of said second layer,
   wherein said extension means comprises a plurality of annular, concentric rings in juxtaposition laterally surrounding said junction and being arranged, in a lateral direction away from said junction, alternately a ring (16-18) of a semiconductor material of a second conductivity type opposite to that of said first layer and a ring (19-21) of a semi-insulating material having different characteristics from said semi-conductor material of both said first layer (1) and rings (16-18) of said second conductivity type, and
   each said ring (19-21) of a semi-insulating material is situated within said first layer (1), comprises dopants and is electrically inactive compared to said surrounding first layer (1) such that this ring (19-21) possesses a semi-insulating resistivity.

31. A device according to claim 30, wherein each said ring (16-18) of semi-conductor material of second conductivity type opposite said first layer (1) is also situated within said first layer (1) and dopants are implanted into each said ring (16-18) of semi-conductor material of second conductivity type for locally changing conductivity of said rings (16-18) with respect to said first layer (1) and followed by making said rings (16-18) electrically active, and
   the dopants are implanted into each said ring (19-21) of semi-insulating material within said first layer (1) without making each said ring (19-21) of semi-insulating material electrically active, such that each said ring (19-21) of semi-insulating material possesses resistivity making the same semi-insulating.

32. A semiconductor device comprising
   a first layer (1) of a semiconductor material having an energy gap between the conduction band and the valence band exceeding 2.2 eV and being doped according to a first conductivity type, n or p,
   a second layer (3) situated on top thereof arranged to form a junction (15) blocking current in a reverse biased state of the device at an interface to said first layer (1),
   extension means for extending a termination of said junction (15) and distributing the electric field within said first layer (1) laterally with respect to a lateral border (6) of said second layer (3),
   wherein said extension means comprises a ring (19) of a semi-insulating material having different characteristics from material forming said first (1) and second (3) layers and embedded in said first layer (1), situated adjacent and underneath said lateral border (6) of said second layer (3) and contacting both said first (1) and second (3) layers, and
   a series of alternating rings of semi-conductor material (16-18) of a second conductivity type opposite said first layer (1) and semi-insulating material (20, 21) having different characteristics from material forming said first layer (1) and rings of semi-conductor material (16-18) laterally-adjacent said ring (19) of semi-insulating material also having different characteristics from the material forming the rings (16-18) of semi-conductor material and extending away from said lateral border (6).

\* \* \* \* \*